April 14, 1970 EIJU SUGIMOTO 3,506,440
METHOD OF REINFORCING PHOTOSENSITIVE RESISTS FORMED ON PHOTOENGRAVING PLATES
Filed March 21, 1966
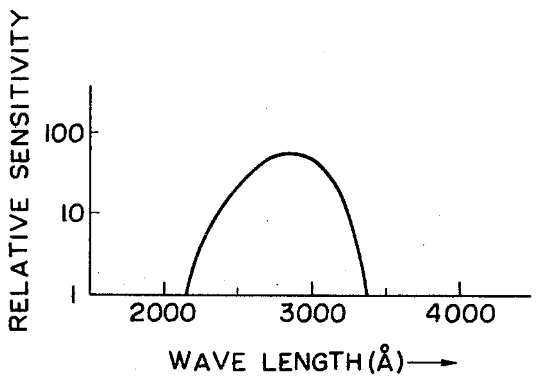
INVENTOR.
EIJU SUGIMOTO
BY Wenderoth, Blanchard & Flynn
ATTORNEYS United States Patent Office 3,506,440
Patented Apr. 14, 1970

3,506,440

METHOD OF REINFORCING PHOTOSENSITIVE RESISTS FORMED ON PHOTOENGRAVING PLATES

Eiju Sugimoto, Tokyo, Japan, assignor to Mitsui Mining & Smelting Co., Ltd.

Filed Mar. 21, 1966, Ser. No. 536,244
Claims priority, application Japan, Mar. 22, 1965, 40/16,636
Int. Cl. G03c *5/00*
U.S. Cl. 96—36 2 Claims

ABSTRACT OF THE DISCLOSURE

The method of reinforcing photosensitive resists which are formed on photosensitive plates and which contain polyvinyl cinnamate as the principal component.

More specifically, a method of reinforcing photosensitive coatings formed on the surfaces of photoengraving plates, after being sensitized and subsequently being dedeloped with an organic solvent, by subjecting the developed resists to light rays containing ultraviolet rays having a wave length ranging from 2200 A. to 3400 A.

It is known to prepare photoengraving plates by using metal plates coated with a photosenstive material containing polyvinyl cinnamate as the principal component and also containing a sensitizer such as 5-nitro-acenaphthene or picramide. The known process of preparing a photoengraving plate comprises the steps of: placing a negative film sheet on a photosenstive resist formed on a metal plate; placing a smooth and flat glass plate upon said negative film sheet to obtain better contact between said negative film sheet and said resist; exposing the assembly of the negative film sheet and the photosensitive resist to a carbon arc light from above said glass plate; removing the portions of the coating not exposed to the light by dissolving these portions with an organic solvent such as trichloroethylene, Cellosolve acetate or methylethyl ketone, since the portions exposed to the carbon arc light have been transformed into individual layers which are insoluble to such an organic solvent; and subsequently etching the dissolved portions of the plate surface with an etching solution.

In the aforesaid known process the phenomenon that the polyvinyl cinnamate resist is converted into an insoluble layer when the resist is exposed to light occurs due to the fact that this compound of polyvinyl cinnamate is transformed into one with a cross-linkage structure by the action of the light. In order to obtain a successful effect of photoengraving, the resulting resist of polyvinyl cinnamate, which now has been bestowed a cross-linkage structure, is required to have a sufficient resistance to an etching solution which comprises, for example, a mixture of nitric acid, sulfonated oil and diethylbenzene.

It has been the case with the conventional resists of this kind that the resists, when underexposed, showed a poor resistance to corrosion during the process of etching. This means that in order to effect the cross-linkage transformation of the polyvinyl cinnamate component to such an extent as would not cause a separation of the photosensitive resist from the plate during the etching process, it was necessary to expose the resist to a fairly large amount of light. This, however, gave rise to a problem that even the portions of the resist beneath the dark areas of the negative film sheet or in other words, the portions of the resist which must not be exposed to light were also sensitized and that as a result, the phenomenon called "fog" took place.

It is, therefore, the primary object of the present invention to provide a method of reinforcing the exposed resists against an etching solution without exposing the resists to an excessive amount of light during the process of manufacturing photoengraving plates using polyvinyl cinnamate as the principal component of the resist.

Another object of the present invention is to provide a method of forming resists which, even after being reinforced, do not produce the so-called "fog" phenomenon and which permit avoidance of an excessive application of light thereto.

Other objects and advantages of the present invention will become readily understood by reading the following description in connection with the accompanying graph.

As a result of studying the sensitizing mechanism of polyvinyl cinnamate, the inventor has found that the cross-linkage transformation of polyvinyl cinnamate is effected by the action of ultraviolet rays having a wave length ranging from 2200 A. to 3400 A., as shown in the accompanying drawing. The present invention has been accomplished by applying this discovery. According to the present invention, a negative film sheet is exposed to light to such an extent as would not cause any "fog" effect, and after the coating has been developed with an organic solvent, the developed resist is exposed to light rays containing ultraviolet rays having a wave length ranging from 2200 A. to 3400 A. to prevent the sensitized resist from being separated from the supporting metal, which tends to occur during the etching process. In other words, in the process of the present invention, application of light to the resist is effected at two different occasions. The resulting sensitized resist shows a satisfactory anticorrosive property against a mixture solution of nitric acid, sulfonated oil and diethylbenzene.

According to the present invention, the initial dosage of light to be applied to the resist is such that will effect a cross-linkage transformation of the polyvinyl cinnamate resist only to an extent enough for preventing a "fog" from taking place, and therefore, even a negative film sheet carrying an image of poor contrasts may be used without any fear that a fog will appear on the resist when it is exposed to light through such film sheet. In addition, the present invention permits that the reinforcement of resists is effected with a quite simple procedure. All that is necessary to do is to apply ultraviolet rays directly to the photosensitive resist formed on the supporting plate. The method of the present invention requires no complicated procedures of reinforcement such as heating the resist or subjecting the resist to chemical treatment. Therefore, the method of the present invention is advantageous over the conventional methods in that the former is highly efficient and contributory to the reduction of manufacturing cost.

The source of ultraviolet rays which is used in the present invention may comprise any type of light source provided that the light rays emitted therefrom contain light rays with a wave length in the range from 2200 A. to 3400 A. However, a light source which emits light rays of which the greater portion consists of such light rays as having a wave length within the aforesaid range is preferred. Such light source includes xenon arcs, mercury vapour lamps and carbon arcs which produce continuous spectrum of light. A light source comprising a sterilizing lamp which produces a strong spectrum of light having a specific wave length of 2537 A. and which is used in the embodiment of the present invention which will be described later is particularly preferred.

Description will now be made on some of the preferred embodiments of the present invention, but it should be understood that the present invention is not restricted thereto and that the present invention is restricted only by the scope of the claims affixed herewith.

EXAMPLE 1

A negative film strip was adherently placed on a photoengraving zinc plate coated with a layer of photosensitive material comprising polyvinyl cinnamate added with 5-nitroacenaphthene as the sensitizer. The resulting assembly was exposed to light from a carbon arc for 30 seconds. After the exposure, the sensitized resist was developed with a trichloroethylene solution. Ultraviolet rays from a sterilizing lamp, Toshiba GL–15, were applied to the resulting resist perpendicularly to the surface of the resist for one minute. The sensitized resist after being treated with the ultraviolet rays showed no separation of the layer from the supporting metal plate after the resist was subjected to etching for 20 minutes with an etching solution composed of 42 Baume nitric acid 14%, sulfonated oil 1%, diethylbenzene 2% and water for the remainder percentage. However, another sensitized resist which was not given the ultraviolet ray treatment developed separation of the layer from the supporting metal plate after the etching process of 20 minutes duration, resulting in an unsuccessful photoengraving. The Toshiba GL–15 sterilizing lamp which has been referred to above stands for "a sterilizing lamp with a trade name of GL–15 (2537 A.), a product of Tokyo Shibaura Denki Kabushiki Kaisha."

EXAMPLE 2

Negative film sheets carrying lines with a width of 50$\mu$, said lines being spaced at a distance of 50$\mu$ from each other, were adherently placed on zinc plates coated with a layer of photosensitive material comprising polyvinyl cinnamate added with picramide as the sensitizer. Light rays from a carbon arc of 30 amperes were applied to the film sheets, one of which was exposed to the light for 30 seconds while the other for 3 minutes. The respective sensitized resists were developed with a Cellosolve acetate solution. The lines printed on the sensitized resist which had been exposed to the light for 30 seconds were noted to have been properly printed, with each line being distinctly and independently reproduced. In contrast to this, the lines printed on the resist which had been subjected to the light exposure lasting for three minutes were noted to be foggy and no independent and distinct lines were formed. Etching was conducted, in the same manner as in the case of Example 1, for 20 minutes by the use of an etching solution composed of nitric acid, sulfonated oil and diethylbenzene. The result was that the resist which had been exposed to the light long enough to develop "fog" also produced separation of some portions of the layer at the sites of the printed lines. In contrast to this, the photosensitive resist which had been exposed to the light for 30 consecutive seconds and which was subsequently exposed to ultraviolet rays from the carbon arc of 30 amperes for 2 minutes did not show any separation of the layer at all after etching lasting for 20 mintues.

The embodiments of the invention in which an exclusive property or privilege is claimed are defined as follows:

1. A process for preparing photoengraving plates comprising the steps of contacting an image-bearing transparency with a metal etchable photoengraving plate component coated with a sensitized coating comprising polyvinyl cinnamate, exposing said plate to light through said transparency thus to generate cohered areas of cross-linked structure in the said coating without causing fogging, developing said coated photoengraving plate by removing the portions of the coating not so cross-linked by means of an organic developing solvent thus to produce a developed image consisting of residual areas of cross-linked polyvinyl cinnamate, exposing said developed plate to ultraviolet light having a wave length ranging from 2200 A. to 3400 A., without resensitizing, thus to reinforce said residual cohered areas and strengthen their resistance to the action of etching acid and etching said plate with etching acid thus to produce a photoengraving plate.

2. The method of claim 1 in which the re-exposing light source is a sterilizing lamp which produces a specific wave length of about 2537 A.

References Cited

UNITED STATES PATENTS

| | | | |
|---|---|---|---|
| 1,840,529 | 1/1932 | Roehrich | 96—36 |
| 2,725,372 | 11/1955 | Minsk | 96—115 X |
| 2,801,233 | 7/1957 | Minsk et al. | 96—115 X |
| 2,827,390 | 3/1958 | Garrigus | 96—36.1 X |
| 2,865,750 | 12/1958 | Treuoy | 96—36 X |

GEORGE F. LESMES, Primary Examiner

R. E. MARTIN, Assistant Examiner

U.S. Cl. X.R.

96—36.3